United States Patent
Ramalingam et al.

(10) Patent No.: US 6,490,166 B1
(45) Date of Patent: *Dec. 3, 2002

(54) INTEGRATED CIRCUIT PACKAGE HAVING A SUBSTRATE VENT HOLE

(75) Inventors: Suresh Ramalingam, Fremont; Nagesh Vodrahalli, Cupertino, both of CA (US); Michael J. Costello, Phoenix, AZ (US); Mun Leong Loke, Chandler, AZ (US); Ravi V. Mahajan, Tempte, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/330,373

(22) Filed: Jun. 11, 1999

(51) Int. Cl.[7] .............................. H01L 21/00; H05K 1/18
(52) U.S. Cl. ...................... 361/760; 361/764; 361/820; 257/778; 257/737; 257/738; 29/841; 438/63; 438/64
(58) Field of Search ................................. 361/760, 772, 361/748, 764, 765, 820; 257/778, 737, 738; 29/840, 843, 844, 841; 438/51, 63, 107, 109, 117, 64

(56) References Cited

U.S. PATENT DOCUMENTS

| 5,173,766 A | * 12/1992 | Long et al. ................. 257/687 |
| 5,218,234 A | 6/1993 | Thompson et al. |
| 5,311,059 A | * 5/1994 | Banerji et al. ............. 257/778 |
| 5,313,365 A | * 5/1994 | Pennisi et al. ............. 361/760 |
| 5,385,869 A | * 1/1995 | Liu et al. ...................... 29/841 |
| 5,450,283 A | * 9/1995 | Lin et al. .................... 361/704 |
| 5,473,512 A | * 12/1995 | Degani et al. ............. 361/760 |
| 5,612,576 A | * 3/1997 | Wilson et al. ............. 257/788 |
| 5,721,450 A | 2/1998 | Miles |
| 5,766,982 A | * 6/1998 | Akram et al. ................ 438/51 |
| 6,038,136 A | 3/2000 | Weber ........................ 361/783 |

FOREIGN PATENT DOCUMENTS

| DE | 2320612 A | 6/1998 |
| EP | 0805486 A | 11/1997 |

* cited by examiner

Primary Examiner—Darren Schuberg
Assistant Examiner—David Foster
(74) Attorney, Agent, or Firm—Blakely, Sokoloff, Taylor & Zafman LLP

(57) ABSTRACT

The present invention involves a method of providing an integrated circuit package having a substrate with a vent opening. The integrated circuit package includes a substrate having an opening and an integrated circuit mounted to the substrate. An underfill material is dispensed between the substrate and the integrated circuit.

16 Claims, 3 Drawing Sheets

INTEGRATED CIRCUIT PACKAGE HAVING A SUBSTRATE VENT HOLE

BACKGROUND

1. Field of the Invention

This invention relates in general to an integrated circuit package, and more particularly, to an integrated circuit package having a substrate vent hole.

2. Description of Related Art

Integrated circuits are typically assembled into a package that is soldered to a printed circuit board. FIG. 1 illustrates a type of integrated circuit package that is commonly referred to as flip chip of C4 package. The integrated circuit 1 contains a number of solder bumps 2 that are soldered to a top surface of a substrate 3.

The package may include an underfill material 4 that is located between the integrated circuit 1 and the substrate 3. The underfill material 4 is typically an epoxy which strengthens the solder joint reliability and the thermo-mechanical moisture stability of the IC package.

The package may have hundreds of solder bumps 2 arranged in a two-dimensional array across the bottom of the integrated circuit 1. The epoxy 4 is typically applied to the solder bump interface by dispensing a single line of uncured epoxy material along one side of the integrated circuit. The epoxy then flows between the solder bumps. The epoxy then flows between the solder bumps. The epoxy must be dispensed in a manner that covers all of the solder bumps 2.

It is desirable to dispense the epoxy 4 at only one side of the integrated circuit to insure that air voids are not formed in the underfill. Air voids weaken the structural integrity of the integrated circuit/substrate interface. Such air voids are typically formed from trapped air or from gasses released during the underfill cure process. Moisture released during the underfill process may also be absorbed by the substrate, resulting in delamination and other reliability-related failures during the surface mount process. Moreover, the bumps may extrude into the voids during thermal loading, particularly for packages with a relatively high bump density.

Accordingly, there is a need in the technology for an apparatus and method for providing an integrated circuit package that avoids the aforementioned problems.

SUMMARY

The present invention involves a method of providing an integrated circuit package having a substrate with a vent opening. The integrated circuit package includes a substrate having an opening and an integrated circuit mounted to the substrate. An underfill material is dispensed between the substrate and the integrated circuit.

BRIEF DESCRIPTION OF THE DRAWINGS

The features and advantages of the present invention will become apparent from the following detailed description of the present invention in which.

DESCRIPTION

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention unnecessarily.

Figure 1:
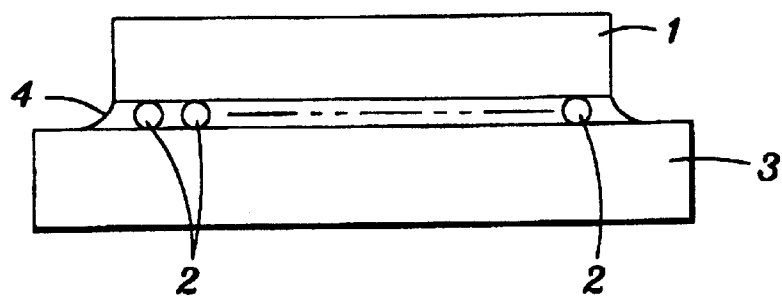
FIG. 1 is a side view of an integrated circuit package of the prior art.
Figure 2A:
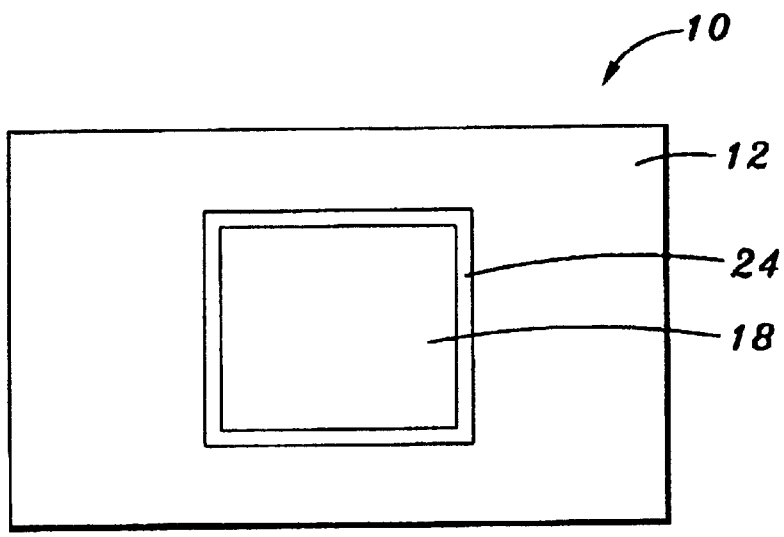
FIG. 2A is a top view of an embodiment of an integrated circuit package of the present invention.
Figure 2B:
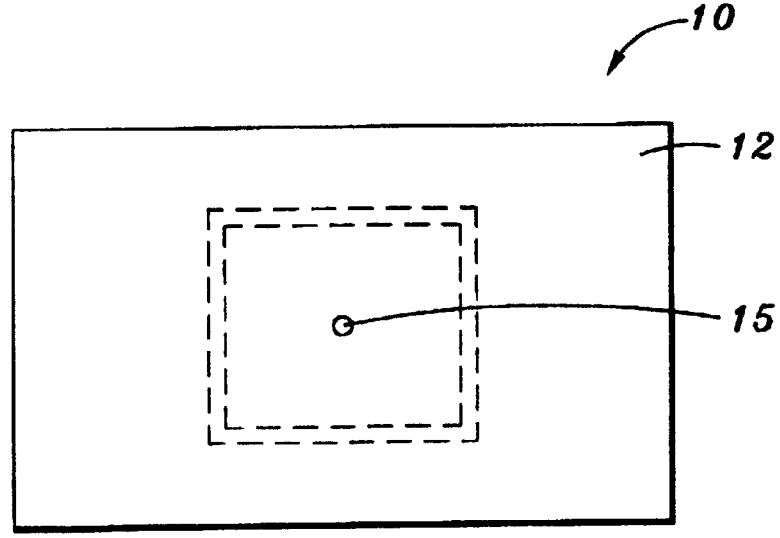
FIG. 2B is a bottom view of the integrated circuit package as shown in FIG. 2A.
Figure 3:
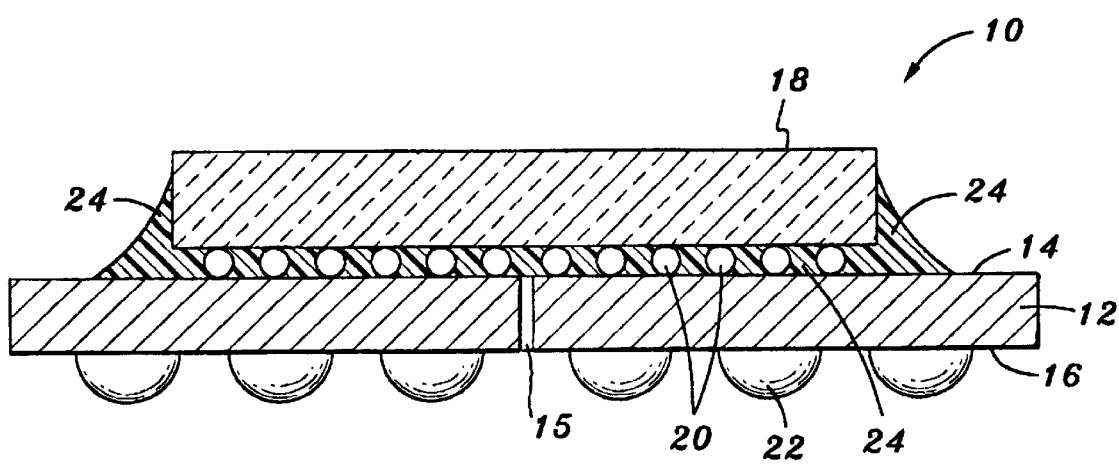
FIG. 3 is an enlarged side view of one embodiment of the integrated circuit package of FIGS. 2A and 2B.

FIGS. 2A and 2B are respectively, a top and bottom view of an integrated circuit package of the present invention. FIG. 3 is an enlarged side view of one embodiment of the integrated circuit package of FIGS. 2A and 2B. With reference to FIGS. 2A–2B and 3, the package 10 may include a substrate 12 which has a first surface 14 and a second opposite surface 16. An integrated circuit 18 may be attached to the first surface 14 of the substrate 12 by a plurality of solder bumps 20. The solder bumps 20 may be arranged in a two-dimensional array across the integrated circuit 18 and to the substrate 12 with a process commonly referred to as controlled collapse chip connection (C4).

The solder bumps 20 may carry electrical current between the integrated circuit 18 and the substrate 12. In one embodiment the substrate 12 may include an organic dielectric material. The package 10 may include a plurality of solder balls 22 that are attached to the second surface 16 of the substrate 12. The solder balls 22 can be reflowed to attach the package 10 to a printed circuit board (not shown).

The substrate 12 may contain routing traces, power/ground planes, vias, etc., which electrically connect the solder bumps 20 on the first surface 14 to the solder balls 22 on the second surface 16. The substrate 12 also includes a substrate vent opening 15 that is provided through the substrate at a predetermined location. In one embodiment, the substrate vent opening 15 is located at a low stress area of the substrate. In another embodiment, the substrate vent opening 15 is located at the center of the substrate 12. In a further embodiment, the substrate vent opening 15 is sized to provide efficient out-gassing of moisture, while preserving the stability and integrity of the substrate 12. In one embodiment, the substrate opening is selected from a range from 20–62 mm in diameter, although in alternate embodiments, the size of the substrate vent opening 15 may be determined according to need and other design specifications.

The package 10 may include an underfill material 24 that is located between the integrated circuit 18 and the substrate 12. The underfill material 24 may form a circumferential fillet that surrounds and seals the edges of the IC 18. The uniform sealing function of the underfill material 24 may inhibit moisture migration, and cracking of the IC 18. The seal process may also reduce delamination. The underfill material 24 also reduces stresses on the solder bumps 20. In one embodiment, the underfill material 24 is an epoxy. The integrated circuit 18 may be encapsulated by an encapsulant (not shown). The encapsulant may be an injection molded material. Additionally, the package 10 may incorporate a thermal element (not shown) such as a heat slug or a heat sink to remove heat generated by the integrated circuit 18.

FIGS. 4A–D illustrates a process for assembling the package 10. In one embodiment, the process is a single pass four-sided dispensing process. In particular, the use of a vent hole 15 in implementing the IC package 10 facilitates the use of a single pass four-sided dispensing process.

Figure 4A:
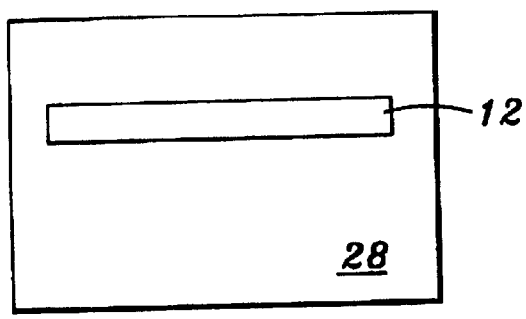
FIGS. 4A–D are schematics showing a process for assembling the integrated circuit package of FIGS. 2A and 2B.

A substrate vent opening 15 is first drilled or lazed into the substrate 12 at a predetermined location during the substrate manufacturing process. The substrate 12 may then be baked in an oven 28 to remove moisture from the substrate material, as shown in FIG. 4A. The substrate 12 is preferably baked at a temperature greater than the process temperatures of the underfill process steps to insure that moisture is not released from the substrate 12 in the subsequent steps. By way of example, the substrate 12 may be baked at 163 degrees Centigrade (C).

Figure 4B:
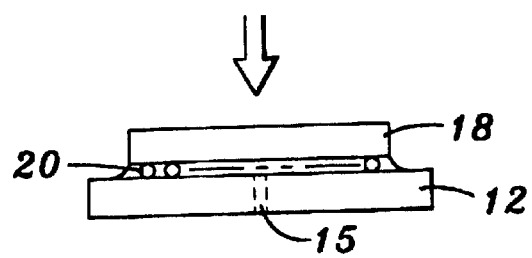

The integrated circuit 18 may then be mounted onto the substrate 12, as shown in FIG. 4B. The integrated circuit 18 is typically mounted by reflowing the solder bumps 20.

Figure 4C:
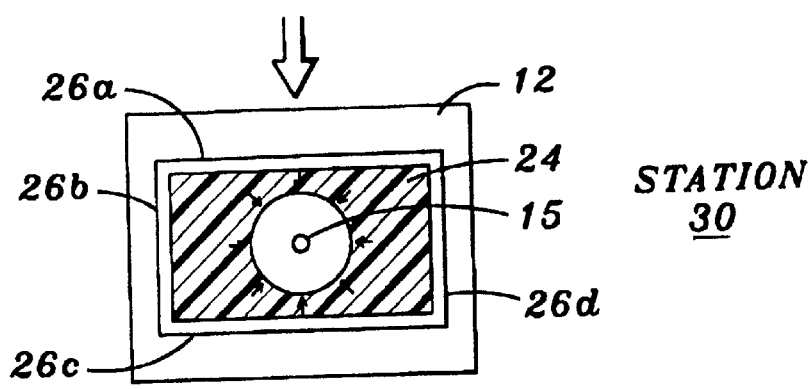
Figure 4D:
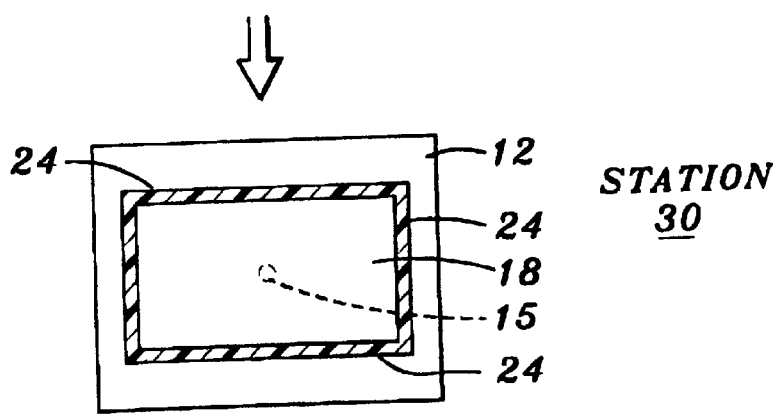

The underfill material 24 may be dispensed onto the substrate 12 along all four sides 26a–d of the IC 18 at a dispensing station 30, as shown in FIGS. 4C and 4D. FIG. 4C illustrates the flow of a typical underfill material 24 when the underfill material 24 is dispensed along all four sides 26a–d of the IC 18. FIG. 4D illustrates a top view of the underfilled IC package 10 having a substrate vent hole 15.

The underfill material 24 may be dispersed in a manner which creates a fillet that encloses and seals the IC 18. One advantage of using the four-sided dispense pattern is that it is able to form a uniform fillet at all four sides of the IC 18. A non-uniform fillet can result to cracking of the IC 18. In addition, the use of a four sided dispense process typically results in a fillet that provides a tight seal, so that delamination between the IC 18 and the underfill material 24 and/or between the underfill material 24 and the substrate 12 does not occur. This in turn results in strong adhesion between the IC 18 and the underfill material 24 and/or between the underfill material 24 and the substrate 12. The process control for forming this uniform fillet is simple and the process yield is high. By way of example, the underfill material 24 may be dispensed at a temperature of approximately 80°–120° C.

The use of a single pass dispense pattern reduces the underfill material interaction effects of multiple passes. During multiple passes, the underfill material is subjected to heating and gelling before subsequent passes. The use of a single pass dispense process results in a more robust process, reduced processing time and eliminates the need for tight material gelling control.

The underfill material 24 may be cured into a hardened state. The underfill material 24 may be cured at a temperature of approximately 150° C. After the underfill material 24 is cured, solder balls 22 can then be attached to the substrate 12, typically with a reflow process, to complete the package 10.

The implementation of the present invention reduces void formation by allowing out-gassing of trapped air from the center of the substrate 12 when the underfill material 24 is dispensed at four sides of the IC 18. In addition, the vent hole 15 allows the underfill material 24 to flow under capillary effect before and during the curing process. As a result, the time control of the underfill material 24 is not as critical as compared to existing processes in which multiple passes are required. This provides the opportunity for eliminating infra red (IR) and/or convective heating, which are typically required in processes utilizing multiple passes, so as to enhance the underfill material 24 flow for subsequent dispense passes.

The use of a substrate vent hole 15 also shortens the flow travel distance to half, since a four sided dispense process may be used, as described above. This in turn reduces the time needed for providing a full underfill and thus provides the opportunity for eliminating a flow enhancement heating process, such as the IR and BTU heating processes, after underfill dispensing. The use of a vent hole 15 reduces the characterization work needed for underfill process development, which in turn reduces the intense handling and timing interaction associated with the equipment and process. As a result, operational costs are reduced, while manufacturing yields are increased.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A process for assembling an integrated circuit, comprising:

providing an opening through a substrate;

attaching an integrated circuit to said substrate;

out-gassing through the opening while dispensing an underfill material at at least one side of the integrated circuit, the underfill material filling a space between said integrated circuit and said substrate.

2. The process of claim 1, wherein the act of providing comprises:

drilling said opening through said substrate.

3. The process of claim 1, wherein the act of providing comprises lazing said opening through said substrate.

4. The process of claim 1, wherein the act of providing comprises providing said opening of a predetermined location of said substrate.

5. The process of claim 1, wherein in the act of providing comprises providing said opening at a low-stress location of said substrate.

6. The process of claim 1, wherein the act of providing comprises providing said opening at a center of said substrate.

7. The process of claim 1, further comprising attaching a solder ball to said substrate.

8. A process for underfilling an integrated circuit, comprising:

providing a substrate having a single vent opening, said single vent opening having a diameter ranging from about 20 mm to about 62 mm;

mounting said integrated circuit to said substrate, said integrated circuit having four sides; and out-gassing through said single vent opening while dispensing an underfill material along said four sides of said integrated circuit, said underfill material being attached to said integrated circuit and said substrate, said underfill material completely filling a space between said integrated circuit and substrate; and said dispensing comprising a single pass dispensing pattern.

9. The process of claim 8, further comprising:

curing said underfill material.

10. A process comprising:

providing a single vent opening through a substrate, said single vent opening having a diameter ranging from about 20 mm to 62 mm;

attaching and integrated circuit to said substrate, said integrated circuit having four sides; and out-gassing through said single vent opening while dispensing an underfill material along said four sides of said integrated circuit, said underfill material completely filling a space between said integrated circuit and said substrate, and said dispensing comprising a single pass dispensing pattern.

11. The process of claim 10, wherein the act of providing comprises drilling said opening through said substrate.

12. The process of claim 10, wherein the act of providing comprises lazing said opening through said substrate.

13. The process of claim 10, wherein the act of providing comprises providing said opening at a low-stress location of said substrate.

14. The process of claim 10, wherein the act of providing comprises providing said opening at a center of said substrate.

15. The process of claim 10, further comprising attaching a solder ball to said substrate.

16. The process of claim 10, wherein said substrate has a first surface and a second opposite surface, said opening extending from the first surface to the second opposite surface.

* * * * *